United States Patent
Ghai

(10) Patent No.: US 6,265,761 B1
(45) Date of Patent: Jul. 24, 2001

(54) SEMICONDUCTOR DEVICES WITH IMPROVED LEAD FRAME STRUCTURES

(75) Inventor: Ajay K. Ghai, San Jose, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/307,095

(22) Filed: May 7, 1999

(51) Int. Cl.$^7$ .......................... H01L 21/58; H01L 23/28; H01L 23/48; H01L 23/495
(52) U.S. Cl. .......................... 257/666; 257/676; 257/672; 257/670; 257/692; 257/696; 257/735; 257/784; 438/123; 438/124; 438/127; 174/52.2; 174/52.4
(58) Field of Search ..................... 257/666, 669–674, 257/676, 684, 696, 784, 692, 735; 174/52.4, 52.2; 438/123, 124, 127

(56) References Cited

U.S. PATENT DOCUMENTS

| | | | |
|---|---|---|---|
| 4,857,989 | * 8/1989 | Mori et al. ............................ | 257/666 |
| 4,943,843 | 7/1990 | Okinaga et al. . | |
| 5,153,706 | 10/1992 | Baba et al. . | |
| 5,198,883 | * 3/1993 | Takahashi et al. .................... | 257/676 |
| 5,252,854 | * 10/1993 | Arita et al. .......................... | 257/676 |
| 5,264,730 | * 11/1993 | Matsuzaki et al. ................... | 257/787 |
| 5,293,065 | * 3/1994 | Chan .................................... | 257/667 |
| 5,302,849 | * 4/1994 | Cavasin ................................ | 257/666 |
| 5,428,248 | * 6/1995 | Cha ...................................... | 257/676 |
| 5,436,500 | * 7/1995 | Park et al. ............................ | 257/696 |
| 5,471,088 | * 11/1995 | Song .................................... | 257/668 |
| 5,521,428 | * 5/1996 | Hollingsworth et al. ............ | 257/670 |
| 5,541,446 | 7/1996 | Kierse et al. . | |
| 5,554,886 | * 9/1996 | Song .................................... | 257/666 |
| 5,770,888 | * 6/1998 | Song et al. ........................... | 257/696 |
| 5,821,605 | 10/1998 | Hong et al. . | |
| 5,834,837 | * 11/1998 | Song .................................... | 257/692 |
| 5,886,405 | * 3/1999 | Kim et al. ............................ | 257/692 |
| 5,900,582 | 5/1999 | Tomita et al. . | |
| 5,929,514 | * 7/1999 | Yalamanchili ....................... | 257/676 |
| 5,949,138 | * 9/1999 | Palasi et al. ......................... | 257/712 |
| 5,963,433 | * 10/1999 | Kim ..................................... | 361/813 |
| 5,969,416 | * 10/1999 | Kim ..................................... | 257/692 |
| 6,043,430 | * 3/2000 | Chun ................................... | 257/673 |
| 6,118,174 | * 9/2000 | Kim ..................................... | 257/676 |

FOREIGN PATENT DOCUMENTS

| | | |
|---|---|---|
| 196 53 782 | 7/1998 | (DE) . |
| 197 04 343 | 8/1998 | (DE) . |
| 0 623 953 | 11/1994 | (EP) . |

\* cited by examiner

*Primary Examiner*—Alexander O. Williams
(74) *Attorney, Agent, or Firm*—Blakely, Sokoloff, Taylor & Zafman LLP

(57) ABSTRACT

A lead frame to support a semiconductor die within an encapsulating package. The lead frame includes a first rail and a second rail in a first plane, with the second rail parallel to and spaced apart from the first rail by more than the length of the package. A first bar and a second bar are connected perpendicularly to the first and second rails, with the second bar spaced apart from the first bar by more than the width of the package. A lead is connected perpendicularly to the first bar with an unconnected lead end extending toward the second bar and located to extend under the supported semiconductor die. A first support tab is connected perpendicularly to the first rail with a first unconnected tab end extending toward the second rail and located to extend under the supported semiconductor die. A second support tab is connected perpendicularly to the second rail with a second unconnected tab end extending toward the first rail and located to extend under the supported semiconductor die.

28 Claims, 2 Drawing Sheets

SEMICONDUCTOR DEVICES WITH IMPROVED LEAD FRAME STRUCTURES

BACKGROUND OF THE INVENTION

1. Field of the Invention

The present invention relates to semiconductor packages and a method of packaging a semiconductor device. More particularly, the present invention relates to a lead frame for a semiconductor package and a method of packaging a semiconductor device using the lead frame.

2. Background Information

In the fabrication of conventional semiconductor devices, a lead frame is used to support the semiconductor die and to provide electrical connection to the die. The leads have an inner portion nearest the die that will be enclosed by a package body, and an outer portion that remains outside the body to allow connections to be made to the circuits on the die. The die is supported on a paddle portion of the lead frame, with wires being connected from bonding pads on the die to the inner portion of the leads. The package body, which may be formed by molding processes, encloses the semiconductor die, the connecting wires, and the inner portion of the leads.

Lead frames are made from flat sheet stock, with integral side rails along the sides of the lead frames. For each lead frame, a plurality of leads are located between the side rails, with additional tie bars supporting the outer portion of the leads between the side rails. The paddle, which will support the semiconductor die, is located at the center of the lead frame and integrally connected to the outer portions of the lead frame structure, typically near the center line of the paddle.

The semiconductor die may be attached to the paddle of the lead frame using a double sided adhesive tape or an epoxy adhesive. After the wire bonding between the bonding pads formed on the semiconductor die and the inner leads of the lead frame is complete, the package body is molded around all of the other elements, except for the outer leads, to thereby form the semiconductor package. Finally, the side rails and tie bars are cut away and the outer leads are formed to the desired shape.

In many prior art packages, the semiconductor die is positioned on the paddle with clearance between the semiconductor die and the inner ends of the leads. As a result, the width of the semiconductor die is limited to somewhat less than the distance between the opposing inner ends of the leads. The maximum distance between the opposing inner ends of the leads is limited by the width of the semiconductor package, reduced by the distance that the inner ends of the leads must extend into the package body for mechanical support and wire bonding purposes.

Increasing complexity of integrated circuits has resulted in larger sizes of semiconductor dice. At the same time, users of packaged circuits are demanding smaller packages to permit reduction in the size of products, or increases in product capabilities without an increase in product size. For example, Maxim Integrated Products of Sunnyvale, Calif. provides eight lead and ten lead semiconductor packages with a nominal package body size of 3 mm square. As the die size increases and/or the package size decreases, the length of the inner portion of the leads must be reduced. Leads with a short inner lead portion are prone to mechanical failure when the outer leads are formed during device fabrication or during later assembly operations.

Lead frame designs have been proposed that eliminate the paddle and support the die on the inner portions of the leads. Since the inner ends of the leads are unconnected, they provide a cantilevered support that is inherently less rigid than a structure employing a paddle. The lack of rigidity can present difficulties in the packaging process, such as in the joining of the die to the frame and in the bonding of wires to the die.

Accordingly, there is a need to provide a lead frame that allows a larger semiconductor die to be packaged relative to the size of the package body while maintaining good mechanical support for the leads in the finished assembly. Further, the lead frame should provide good mechanical support for the die during the packaging process.

SUMMARY OF THE INVENTION

A lead frame to support a semiconductor die within an encapsulating package is disclosed. The lead frame includes a first rail and a second rail in a first plane, with the second rail parallel to and spaced apart from the first rail by more than the length of the package. A first bar and a second bar are connected perpendicularly to the first and second rails, with the second bar spaced apart from the first bar by more than the width of the package. A lead is connected perpendicularly to the first bar with an unconnected lead end extending toward the second bar and located to extend under the supported semiconductor die. A first support tab is connected perpendicularly to the first rail with a first unconnected tab end extending toward the second rail and located to extend under the supported semiconductor die. A second support tab is connected perpendicularly to the second rail with a second unconnected tab end extending toward the first rail and located to extend under the supported semiconductor die.

DETAILED DESCRIPTION

The present invention provides, among other things, a lead frame that allows a larger semiconductor die to be packaged relative to the size of the package body while maintaining good mechanical support for the leads and support for the die during packaging.

Figure 1:
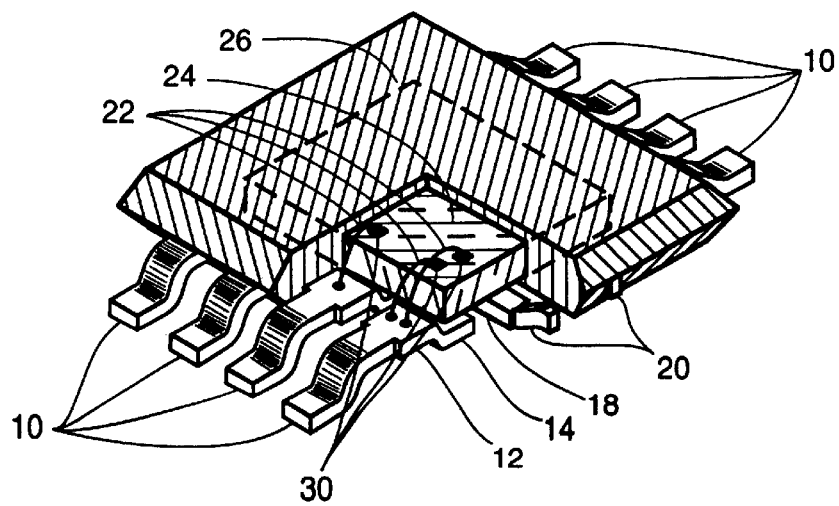
FIG. 1 is a perspective view of a semiconductor device employing an embodiment of the invention.

FIG. 1 is schematic perspective view of a semiconductor device using a lead frame embodying the present invention. The front quarter of the package body 26 has been cut away to illustrate the lead frame relative to the semiconductor device. The embodiment shown has eight leads providing connections to a semiconductor die 24. Each lead consists of an outer portion 10 and an inner portion which in turn is made up of two segments, a first segment 12 that is connected to the outer portion 10 and a second segment 14 connected to the first segment 12. The inner portions of the leads are entirely within the package body 26 of the completed device. The outer portions of the leads 10 are substantially outside the package body 26. The leads 10 enter the package body approximately at the midplane of the package body 26. The outer portions of the leads 10 are formed to a shape suitable for connection to a circuit board. The inner portions 12, 14 of the leads 10 are preferably wider than the outer portions of the leads.

The bottom surface of the semiconductor die 24 is supported by and adhesively joined to the inner unconnected ends of the two support tabs 18 and the eight leads 14. The support tabs 18 and the second segments of the leads 14 are downwardly offset from the first segments 12 to pass under the semiconductor die 24. The semiconductor die 24 is electrically connected to the leads 10 by bond wires 22, connected at one end to bonding pads 30 on the upper surface of the semiconductor die 24 and connected at the other end to the first segment of the leads 12. The downward offset of the support tabs 18 and the second segments 14 locates the first segments 12 closer to the top surface of the semiconductor die 24, preferably near or above the midplane of the die 24, to facilitate routing of the bond wires 22. The semiconductor die 24, the support tabs 18, the bond wires 22, and the middle portion 12 and the inner portion 14 of the leads are enclosed by the package body 26.

Figure 2:
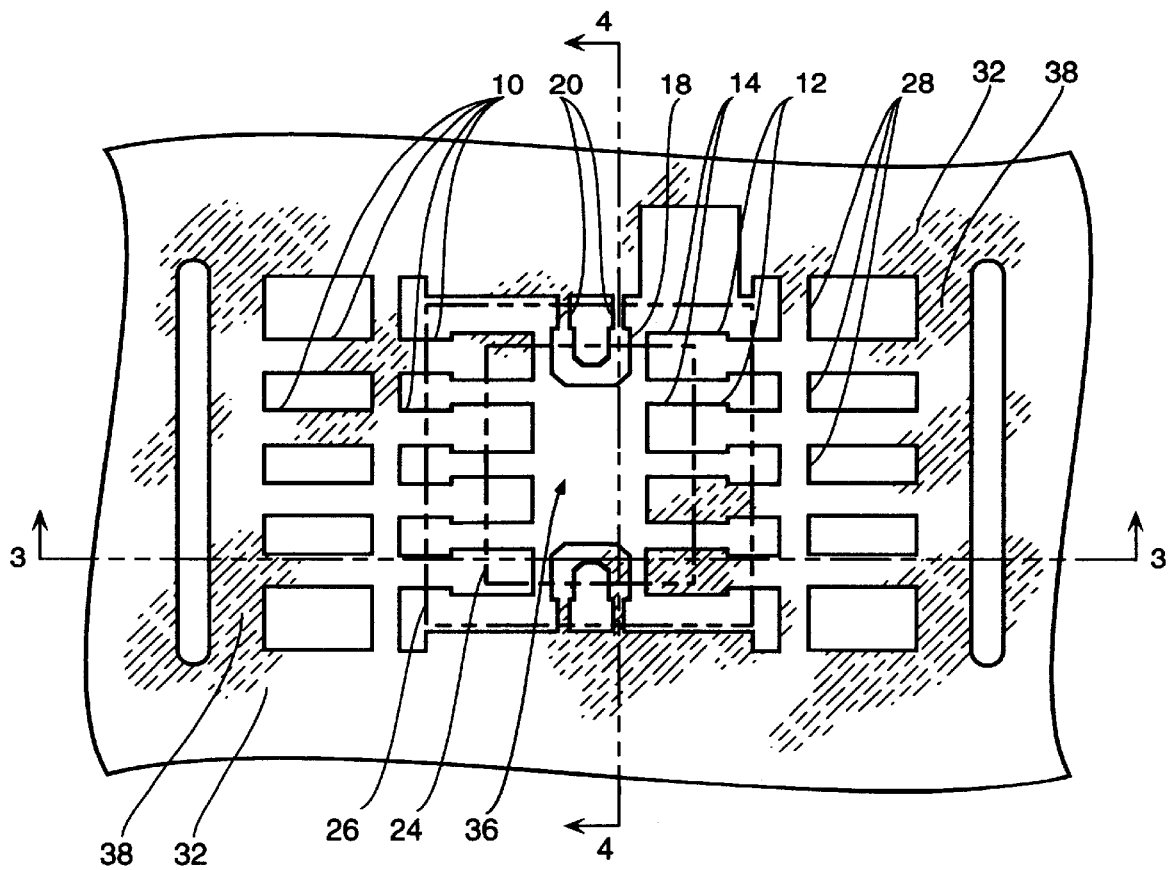
FIG. 2 is a plan view of a portion of a lead frame that embodies the invention.

FIG. 2 is a planform view of an embodiment of the lead frame structure of the present invention. The lead frame generally consists of side rails 32 connected by side bars 38 to form a rectangular region within which the lead frame is formed. The lead frame includes two support tabs 18 connected to the side rails 32 by connecting bars 20, outer leads 10 that are held in position with tie bars 28, and inner leads 12, 14 which extend inwardly from the outer leads 10. The area 36 between the support tabs may be left open. The support tabs 18 increase the rigidity of the assembly during fabrication because the cantilever of the support tabs 18 is substantially shorter than that of the inner leads 12, 14. The lead frame is preferably made from electrically conductive material, such as a copper alloy. More than one lead frame is typically formed on a single sheet of material, and additional elements may be present on the sheet such as stress reliefs and locating holes as are well known in the art.

The width of the outer lead portion 10 in one embodiment is between approximately 0.25 and 0.36 mm, with an approximate center-to-center spacing of 0.65 mm. The inner lead portion 12, 14 has a width between approximately 0.41 and 0.45 mm. In another embodiment, the outer lead 10 width is between approximately 0.18 and 0.27 mm, the center to center spacing is 0.50 mm, and the inner lead 12, 14 width is between approximately 0.26 and 0.30 mm. The widths of the inner lead portions are preferably controlled by making the gaps between them as small as the manufacturing process will allow, while maintaining electrical isolation. If the lead frame is manufactured with standard chemical etching techniques, the gap can be generally as small as the lead frame is thick, typically between 0.13 and 0.18 mm.

Figure 3A:
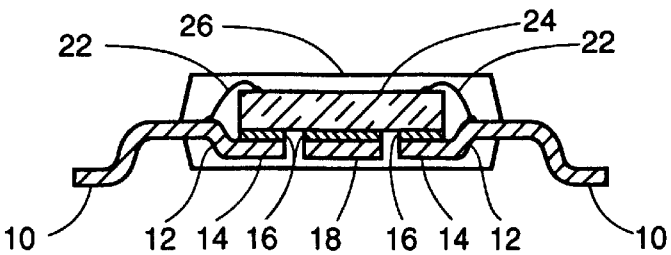
FIG. 3a is a first sectional view of a semiconductor device assembled with the lead frame of FIG. 2, shown along line 3—3.

FIG. 3a is a sectional view of a semiconductor package assembled with the lead frame structure of FIG. 2, taken along line 3—3 of FIG. 2. The second segments of the inner leads 14 extend underneath and support the semiconductor die 24. Electrically insulating adhesive 16, such as Ablestik 84-3J or 8388, joins the die 24 to the inner leads 14, holding the die 24 in place for the remaining packaging steps. The thickness of the adhesive 16, preferably about 0.03 mm, has been exaggerated for clarity; the top surfaces of the first segments 12 are closer to the top surface of the die 24 than they appear, being substantially at or above the midplane of the die. In the embodiment shown, the support tabs are also adhesively attached to the bottom surface of the die. In another embodiment (not shown), the support tabs provide mechanical support without being attached to the bottom surface of the die.

The first segments of the inner leads 12 are electrically connected to bonding pads on the die 24 with bond wires 22. The die 24 and the inner lead portions 12, 14 are encapsulated in a molding compound 26. The upper plane of the lead frame structure substantially coincides with the midplane of the package body in the embodiment shown. The wider inner lead portion 12, 14 increases the mechanical support for the outer lead portion. Offsetting the second segment of the inner lead 14 allows a larger die 24 to be used relative to the size of the package body 26.

In the embodiment shown, a die 24 of about 1.9 mm by 2.3 mm can be placed in a package body of about 3 mm square. On the sides of the package body 26 that receive the leads, there is a distance of about 0.55 mm between the edge of the package body 26 and the maximum sized die 24. On the remaining sides, the distance between the package body 26 and the maximum sized die 24 is about 0.35 mm. In other embodiments, the distance between the sides of the package body 26 that receive the leads and the outer edge of the die 24 may be further reduced. Thus, a substantially larger die may be packaged using the lead frame of the present invention as compared to a conventional lead frame which requires a minimum of about 0.68 mm between the sides of the package body and the die. The inner lead 14 should support at least 10% of the die width to provide proper support. Thus, the minimum width die suitable for use with the present invention has a width of about 1.2 times the distance between the inner ends of the opposing leads for packages with dual in-line lead configurations. The edge of the die should be no more than about 0.7 mm from the edge of the package body so that the cantilever support of the leads and the support tabs remains sufficiently rigid during fabrication.

Figure 4:
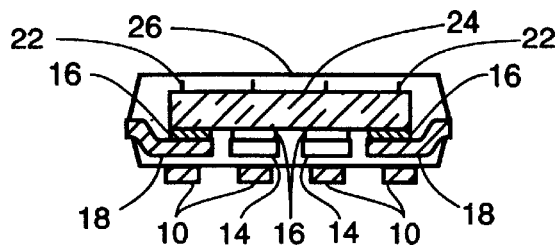
FIG. 4 is a second sectional view of a semiconductor device assembled with the lead frame of FIG. 2, shown along line 4—4.

FIG. 4 is a sectional view of a semiconductor package assembled with the lead frame structure of FIG. 2, taken along line 4—4 of FIG. 2. The support tabs 18 are downwardly offset from the side rails 32 (FIG. 2) of the lead frame. The connector bars 20 join the support tabs 18 to the side rails 32. The support tabs 18 provides a rigid support for the die during fabrication because it is connected to the side rails 32 of the lead frame at both ends by the connector bars 20.

Figure 3B:
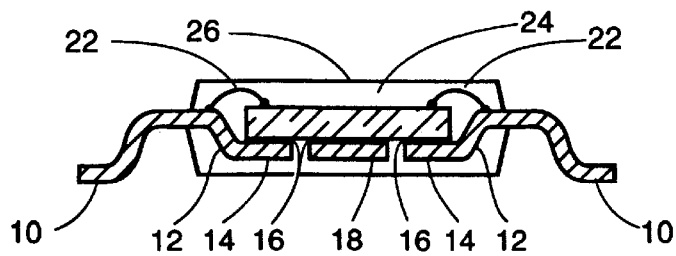
FIG. 3b is a sectional view of another semiconductor device assembled with the lead frame of FIG. 2, shown along line 3—3.

FIG. 3b is a sectional view of another semiconductor package assembled with the lead frame structure of FIG. 2, taken along line 3—3 of FIG. 2. The adhesive 16 is shown more nearly to scale so the relationship between the top surface of the die 24 and the upper surface of the first portion of the leads 12 which receives one end of the bond wires 22 will be better appreciated. Preferably, the offset depth is about equal to the thickness of the semiconductor die. Thus the upper surface of the lead frame is about at the top surface of the die 24. The downset between the first segment 12 and the second segment 14 is preferably at an angle of more than 45°, to provide an area for attaching the bond wire 22 having the width of the inner lead and a depth of about 0.18 mm. The angle of the downset is limited to less than about 70° by present fabrication technology. Most preferably, the downset angle is about 60°.

After the lead frame, bond wires 22 and die 24 have been encapsulated in the molding compound or compounds 26, the tie bars 28 and connector bars 20 (FIG. 2) are cut away so that the leads 10 are electrically isolated from each other and from the support tabs 18. Since the inner portions of the leads 12, 14 are securely anchored in the molding compound 26, their relative positions are maintained after the tie bars are cut. These process steps may be generally in accordance with the corresponding prior art processing steps.

Figure 5:
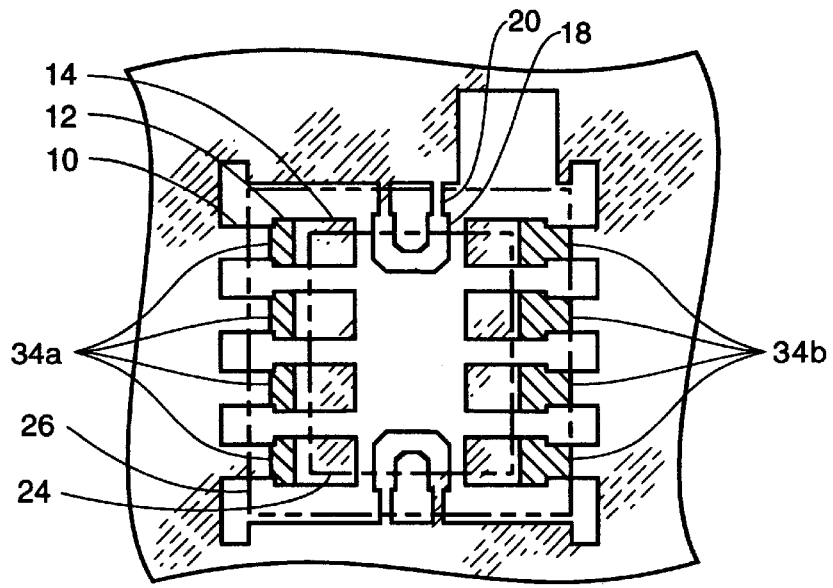
FIG. 5 is a plan view of a portion of a lead frame of another embodiment of the invention.

FIG. 5 shows a portion of another embodiment of a lead frame constructed according to the teachings of the present invention. The first segment of the inner lead 12 is metal plated, preferably with a metal such as silver or nickel-palladium alloy, to facilitate the connection of the bond wire 22 by a wire joining process such as thermosonic bonding. The second segment of the inner lead 14, the support tabs 18, and the connecting bars 20 may or may not be plated to facilitate the adhesive joining to the die 24. Plated areas 34a illustrate the minimum area to be plated, while plated areas 34b illustrate the maximum area. The leads 10 may be plated on the portion which will be inside the package body 26.

Numerous other variations and alternate embodiments will occur to those skilled in the art without departing from the spirit and scope of the invention. For example, although specific illustrative inner lead portion shapes are used in the drawings, other shapes may be used that extend under the die to provide substantial mechanical support for the outer leads. Other shapes may be used for the support tabs and connecting bars to provide mechanical support for the semiconductor die during fabrication. In addition, although a 8-lead package is used to illustrate the invention, the enhanced lead frame structure can be implemented in any semiconductor package. Accordingly, it is intended that the invention be limited only in terms of the appended claims.

What is claimed is:

1. A lead frame to support a semiconductor die within an encapsulating package, consisting essentially of:
    a first rail and a second rail in a first plane, said second rail parallel to and spaced apart from the first rail by more than the length of the encapsulating package;
    a first bar and a second bar connected perpendicularly to the first and second rails, said second bar spaced apart from the first bar by more than the width of the encapsulating package;
    a first plurality of leads connected perpendicularly to the first bar, each of the first plurality of leads having an unconnected lead end extending toward the second bar, said unconnected lead end located to extend under the supported semiconductor die;
    a second plurality of leads connected perpendicularly to the second bar, each of the second plurality of leads having an unconnected lead end extending toward the first bar, said unconnected lead end located to extend under the supported semiconductor die;
    a first support tab connected perpendicularly to the first rail with a first unconnected tab end extending toward the second rail, said first unconnected tab end located to extend under the supported semiconductor die;
    a second support tab connected perpendicularly to the second rail with a second unconnected tab end extending toward the first rail, said second unconnected tab end located to extend under the supported semiconductor die.

2. The lead frame of claim 1, where the portions of the lead and the first and second support tabs that extend under the supported semiconductor die are in a second plane parallel to and spaced downwardly from the first plane.

3. The lead frame of claim 2, where a space between the first plane and the second plane is at least one-half the thickness of the semiconductor die.

4. The lead frame of claim 2, where a space between the first plane and the second plane is about the same as the thickness of the semiconductor die.

5. The lead frame of claim 2, where the portion of the lead in the first plane and the portion of the lead in the second plane are connected by a portion of the lead forming an angle of not less than about forty-five degrees to the first and second planes.

6. The lead frame of claim 5, where the connecting portion of the lead forms an angle of not more than about seventy degrees to the first and second planes.

7. The lead frame of claim 1, where the lead extends under the supported die by at least one-tenth of the semiconductor die width.

8. The lead frame of claim 1, where the distance between the edge of the semiconductor die and the encapsulating package is less than about seven-tenths of a millimeter.

9. The lead frame of claim 1, where the portion of the lead inside the encapsulating package is wider than the portion of the lead outside the encapsulating package.

10. The lead frame of claim 1, where a selected portion of the lead inside the encapsulating package and not under the semiconductor die is plated with metal.

11. A semiconductor device consisting essentially of:
    an capsulating body with roughly a first rectangular solid shape having a package width, lenght, and thickness;
    a semiconductor die with approximately a second rectangular solid shape having a die width, lenght, and thickness;
    a plurality of leads adhesively attached directly to a bottom surface of the semiconductor die an extending outwardly beyond the package width;
    a wire bond coupling each of a plurality of pads on a top surface of the semiconductor die to the plurality of leads at points on the leads between the die width and the package width;
    a first and second support tabs adhesively attached directly to the bottom surface of the semiconductor die and extending outwardly in opposite directions to about the package lenght.

12. The semiconductor device of claim 11, where the portions of the lead and the first and second support tabs that extend beyond the semiconductor die are offset toward the top surface of the semiconductor die and extend in a plane parallel to the bottom surface of the semiconductor die and a point where the wire bond is coupled to the lead is substantially on the plane.

13. The semiconductor device of claim 12, where the plane is about at or above a midplane of the semiconductor die.

14. The semiconductor device of claim 12, where the plane is about at the top surface of the semiconductor die.

15. The semiconductor device of claim 12, where the adhesive is an electrically insulating adhesive.

16. The semiconductor device of claim 11, where the lead is plated with a metal around the point where the wire bond is coupled to the lead.

17. The semiconductor device of claim 16, where the metal is silver.

18. The semiconductor device of claim 11, where the portion of the lead attached to the bottom surface of the semiconductor die covers at least one-tenth of the width of the semiconductor die.

19. The semiconductor device of claim 11, where a distance between the semiconductor die and the encapsulating body is less than about seven-tenths of a millimeter.

20. The semiconductor device of claim 11, where the portion of the lead inside the encapsulating body is wider than the portion of the lead outside the encapsulating body.

21. A method of assembling a semiconductor die in an encapsulating package, comprising:
   forming a lead frame, consisting essentially of
      a first rail and a second rail in a first plane, said second rail parallel to and spaced apart from the first rail by more than the length of the encapsulating package,
      a first bar and a second bar connected perpendicularly to the first and second rails, said second bar spaced apart from the first bar by more than the width of the encapsulating package,
      a first plurality of leads connected perpendicularly to the first bar, each of the first plurality of leads having an unconnected lead end extending toward the second bar, said unconnected lead end located to extend under the supported semiconductor die,
      a second plurality of leads connected perpendicularly to the second bar, each of the second plurality of leads having an unconnected lead end extending toward the first bar, said unconnected lead end located to extend under the supported semiconductor die;
      a first support tab connected perpendicularly to the first rail with a first unconnected tab end extending toward the second rail, said first unconnected tab end located to extend under the supported semiconductor die,
      a second support tab connected perpendicularly to the second rail with a second unconnected tab end extending toward the first rail, said second unconnected tab end located to extend under the supported semiconductor die;
   attaching a bottom surface of the semiconductor die directly to the unconnected lead end;
   connecting an electrically conductive wire to the lead and to a bonding pad on a top surface of the semiconductor die;
   encapsulating the semiconductor die, the support tabs, the lead, and the electrically conductive wire with a circuit package; and
   trimming away the rails and the bars.

22. The method of claim 21, further comprising offsetting the unconnected end of the lead and the unconnected ends of the support tabs downwardly into a second plane parallel to the first plane.

23. The method of claim 21, where a portion of the lead that is encapsulated is wider than a portion of the lead that is not encapsulated.

24. The method of claim 21, further comprising applying metal plating to the lead in the area where the electrically conductive wire is connected.

25. The method of claim 21, wherein said attaching includes attaching at least one-tenth of the width of the semiconductor die to the unconnected lead end.

26. The method of claim 21, wherein said attaching includes adhesively bonding with an electrically insulating adhesive.

27. The method of claim 21, where said attaching further comprises adhesively bonding the bottom surface of the semiconductor die to the support tabs.

28. The method of claim 21, where said lead frame further includes a tie bar connected to the rails and to the lead, and said trimming further comprises trimming away the tie bar.

* * * * *